(12) United States Patent
Sagara et al.

(10) Patent No.: US 7,932,162 B2
(45) Date of Patent: Apr. 26, 2011

(54) METHOD FOR MANUFACTURING A STACKED SEMICONDUCTOR PACKAGE, AND STACKED SEMICONDUCTOR PACKAGE

(75) Inventors: Junya Sagara, Kawasaki (JP); Shinya Takyu, Minamisaitama-gun (JP); Tetsuya Kurosawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 12/249,025

(22) Filed: Oct. 10, 2008

(65) Prior Publication Data

US 2009/0096110 A1 Apr. 16, 2009

(30) Foreign Application Priority Data

Oct. 12, 2007 (JP) ................. 2007-266307

(51) Int. Cl.
*H01L 21/30* (2006.01)
(52) U.S. Cl. ................ 438/455; 257/777; 257/E27.137; 257/E25.013
(58) Field of Classification Search .................. 257/686, 257/777, E27.137, E25.013, E25.006; 438/118, 438/455
See application file for complete search history.

(56) References Cited

U.S. PATENT DOCUMENTS

| | | | |
|---|---|---|---|
| 5,888,883 A | 3/1999 | Sasaki et al. | |
| 6,184,109 B1 | 2/2001 | Sasaki et al. | |
| 6,294,439 B1 | 9/2001 | Sasaki et al. | |
| 6,337,259 B1 | 1/2002 | Ueda et al. | |
| 6,351,028 B1 * | 2/2002 | Akram ........................... | 257/686 |
| 6,465,330 B1 | 10/2002 | Takahashi et al. | |
| 6,777,797 B2 * | 8/2004 | Egawa ........................... | 257/686 |
| 7,208,345 B2 | 4/2007 | Meyer et al. | |
| 2003/0024731 A1 | 2/2003 | Nordal et al. | |
| 2003/0060024 A1 | 3/2003 | Imori | |
| 2003/0218191 A1 | 11/2003 | Nordal et al. | |
| 2004/0026768 A1 * | 2/2004 | Taar et al. ..................... | 257/686 |
| 2004/0155326 A1 | 8/2004 | Kanbayashi | |

FOREIGN PATENT DOCUMENTS

| | | |
|---|---|---|
| JP | 1036030 | 2/1989 |
| JP | 04-350951 | 12/1992 |
| JP | 2001-015677 | 1/2001 |
| JP | 2004-063569 | 2/2004 |
| KR | 10-0488256 | 3/2001 |
| KR | 2003-0026867 | 4/2003 |
| WO | 01/69679 | 9/2001 |

OTHER PUBLICATIONS

Korean Office Action for 2008-0099691 mailed on May 27, 2010.

* cited by examiner

*Primary Examiner* — David Vu
(74) *Attorney, Agent, or Firm* — Turocy & Watson, LLP

(57) ABSTRACT

A method for manufacturing a stacked semiconductor package where a plurality of semiconductor chips are stacked on a substrate, including: forming insulating layers at portions of a wafer corresponding to sides of the plurality of semiconductor chips when the plurality of semiconductor chips are in the wafer; processing the wafer so as to obtain the plurality of semiconductor chips; subsequently stacking the plurality of semiconductor chips on the substrate such that the insulating layers formed at the sides of the plurality of semiconductor chips are respectively positioned at the same side as one another; and forming a wiring over the insulating layers formed at the sides of the plurality of semiconductor chips so that the plurality of semiconductor chips are electrically connected with one another and one or more of the plurality of semiconductor chips are electrically connected with the substrate.

15 Claims, 6 Drawing Sheets

METHOD FOR MANUFACTURING A STACKED SEMICONDUCTOR PACKAGE, AND STACKED SEMICONDUCTOR PACKAGE

CROSS-REFERENCE TO RELATED APPLICATIONS

This application is based upon and claims the benefit of priority from the prior Japanese Patent Application No. 2007-266307 filed on Oct. 12, 2007; the entire contents which are incorporated herein by reference.

BACKGROUND OF THE INVENTION

Various attempts are made so as to satisfy the requirements of increasing the capacity of a semiconductor memory and developing the function of the semiconductor memory. With the increase of the capacitor of the semiconductor memory, a plurality of thinner semiconductor chips are prepared and stacked so as to increase of the total capacity of the semiconductor memory in addition to the increase of the capacity of the semiconductor chip constituting the semiconductor memory. With the development of the semiconductor memory, a plurality of semiconductor chips with respective different functions are prepared and stacked to realize a semiconductor memory which can exhibit different functions.

In a conventional stacked semiconductor package where a plurality of semiconductor chips are stacked as described above, one or more of the semiconductor chips are electrically connected with a board by means of wiring and the semiconductor chips are electrically connected with one another by means of wiring. In the wiring electric connection, however, the wires to be used are shaped in loop so as to prevent unnecessary electric connection with other parts (such as the corner of each semiconductor chip) except the electrodes and the occurrence of leak current. As a result, the total thickness of the semiconductor package is increased.

In this point of view, it is proposed that the semiconductor chips are electrically connected with one another by a wiring layer formed at the side of the stacking structure of the semiconductor chips (e.g., refer to JP-A2004-63569 (KOKAI)). In this case, however, in order to prevent the electric connection between other parts of the semiconductor chips except the electrodes thereof, particularly between the side of the stacking structure of the semiconductor chips and the wiring layer, an insulating layer is formed between the side of the stacking structure and the wiring layer so as to form the electric insulation between the side of the stacking structure and the wiring layer.

However, after the semiconductor chips are stacked, the insulating layer is formed per semiconductor chip. Concretely, the insulating layer is formed at the side of each semiconductor chip. Therefore, it is required that the forming process of the insulating layer is carried out for all of the semiconductor chips to be stacked. Since the number of the forming process of the insulating layer is increased as the number of the semiconductor chips to be stacked is increased, the manufacturing process of the stacked semiconductor package becomes complicated as a whole so as to increase the manufacturing cost of the stacked semiconductor package.

Moreover, since the insulating layer is made of a thermosetting resin, it is required that the assembly under construction including the board is thermally treated as a whole. As a result, the assembly suffers from the thermal treatment several times so that the board and/or one or more of the semiconductor chips may be warped and the characteristics of one or more of the semiconductor chips may be changed.

In the stacking of the semiconductor chips, the adjacent ones of the semiconductor chips are bonded with one another with adhesive. In this case, however, the adhesive may be peeled off by the several thermal treatments so that the adjacent ones of the semiconductor chips are imperfectly bonded with one another.

BRIEF SUMMARY OF THE INVENTION

An aspect of the present invention relates to a method for manufacturing a stacked semiconductor package where a plurality of semiconductor chips are stacked on a substrate, including: forming insulating layers at portions of a wafer corresponding to sides of the plurality of semiconductor chips when the plurality of semiconductor chips are in the wafer; processing the wafer so as to obtain the plurality of semiconductor chips; subsequently stacking the plurality of semiconductor chips on the substrate such that the insulating layers formed at the sides of the plurality of semiconductor chips are respectively positioned at the same side as one another; and forming a wiring over the insulating layers formed at the sides of the plurality of semiconductor chips so that the plurality of semiconductor chips are electrically connected with one another and one or more of the plurality of semiconductor chips are electrically connected with the substrate.

Another aspect of the present invention relates to a stacked semiconductor package, including: a substrate; a plurality of semiconductor chips subsequently formed on the substrate and having respective insulating layers at sides thereof such that the insulating layers of the plurality of semiconductor chips are positioned at the same side as one another; and a wiring formed over the insulating layers at the sides of the plurality of semiconductor chips so that the plurality of semiconductor chips are electrically connected with one another and one or more of the plurality of semiconductor chips is electrically connected with the substrate.

DETAILED DESCRIPTION OF THE INVENTION

Some embodiments will be described with reference to the drawings.

In a conventional method for manufacturing stacked semiconductor chips, after the semiconductor chips are stacked, the insulating layer is formed per semiconductor chip. Concretely, the insulating layer is formed at the side of each semiconductor chip. Therefore, it is required that the forming process of the insulating layer is carried out for all of the semiconductor chips to be stacked. Since the number of the forming process of the insulating layer is increased as the number of the semiconductor chips to be stacked is increased, the manufacturing process of the stacked semiconductor package becomes complicated as a whole so as to increase the manufacturing cost of the stacked semiconductor package.

Moreover, since the insulating layer is made of a thermosetting resin, it is required that the assembly under construction including the board is thermally treated as a whole. As a result, the assembly suffers from the thermal treatment several times so that the board and/or one or more of the semiconductor chips may be warped and the characteristics of one or more of the semiconductor chips may be changed.

In the stacking of the semiconductor chips, the adjacent ones of the semiconductor chips are bonded with one another with adhesive. In this case, however, the adhesive may be peeled off by the several thermal treatments so that the adjacent ones of the semiconductor chips are imperfectly bonded with one another.

First Embodiment

FIGS. 1 to 9 relate to the manufacturing process of a stacked semiconductor device according to a first embodiment. In the drawings, attention is paid to a portion of a wafer so as to clarify the distinctive features of the first embodiment. The portion of the wafer to which attention is paid is enlargedly depicted.

Figure 1:
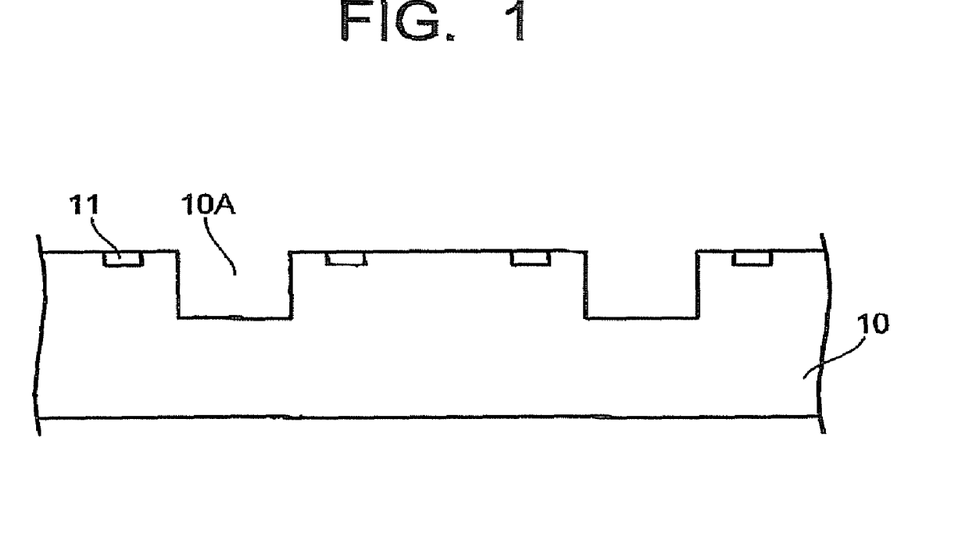
FIGS. 1 to 4, 6, 7 and 8 are cross sectional views showing a first step in the forming method of a stacked semiconductor package according to an embodiment.

As shown in FIG. 1, electrodes 11 are formed of electric conductor such as aluminum on a wafer 10 made of, e.g., silicon, and first trenches 10A are formed at the area except the electrodes 11 of the wafer 10 by means of so-called dicing before grinding (DBG) so as not to penetrate the wafer 10.

Figure 2:
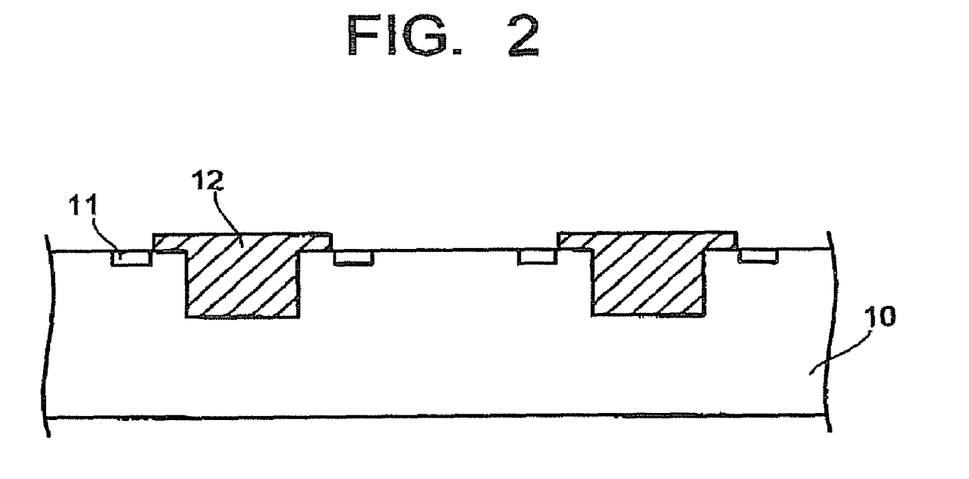

As shown in FIG. 2, insulating resins 12 are formed by ink-jet or printing so as to embed the first trenches 10A. In the use of the ink-jet method, the diameter of the forefront of the nozzle is set to a predetermined size so that the insulating resin 12 is discharged for the first trenches 10A. In the use of the printing method, a mask with a pattern in accordance with the shapes and sizes of the first trenches 10A and the desired pattern to be formed is prepared, and the insulating resins 12 are printed and formed via the mask so as to embed the first trenches 10A. A part of the insulating resin 12 is provided on a top surface of the wafer with the elements being exposed.

As the insulating resin 12 may be exemplified thermoplastic resin and UV cured resin.

Figure 3:
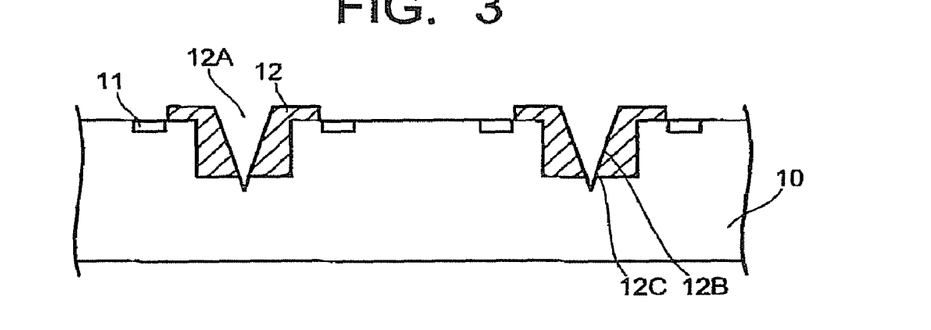

As shown in FIG. 3, dicing process is carried out for the insulating resins 12 formed in the first trenches 10A to form second trenches 12A reaching to the wafer 10 throughout the insulating resins 12, respectively. Herein, since the remaining insulating resins 12 after the second trenches 12A are formed constitutes the insulating layers at the sides of each semiconductor chip, the second trenches 12A are formed so that the insulating layer can be formed as designed.

In FIG. 3, the second trenches 12A are formed in V-shape. In this case, the sides 12B of the remaining insulating resins 12 are tapered by the formation of the second trenches 12A so that the rising angles of the sides 12B becomes relatively small. As described above, the remaining insulating resins 12 constitute the insulating layers at the sides of the semiconductor chips and the lower portions 12C of the insulating resins 12 constitute the lower edge portions of the insulating layers of the semiconductor chip (refer to, FIGS. 8 and 9).

Figure 10:
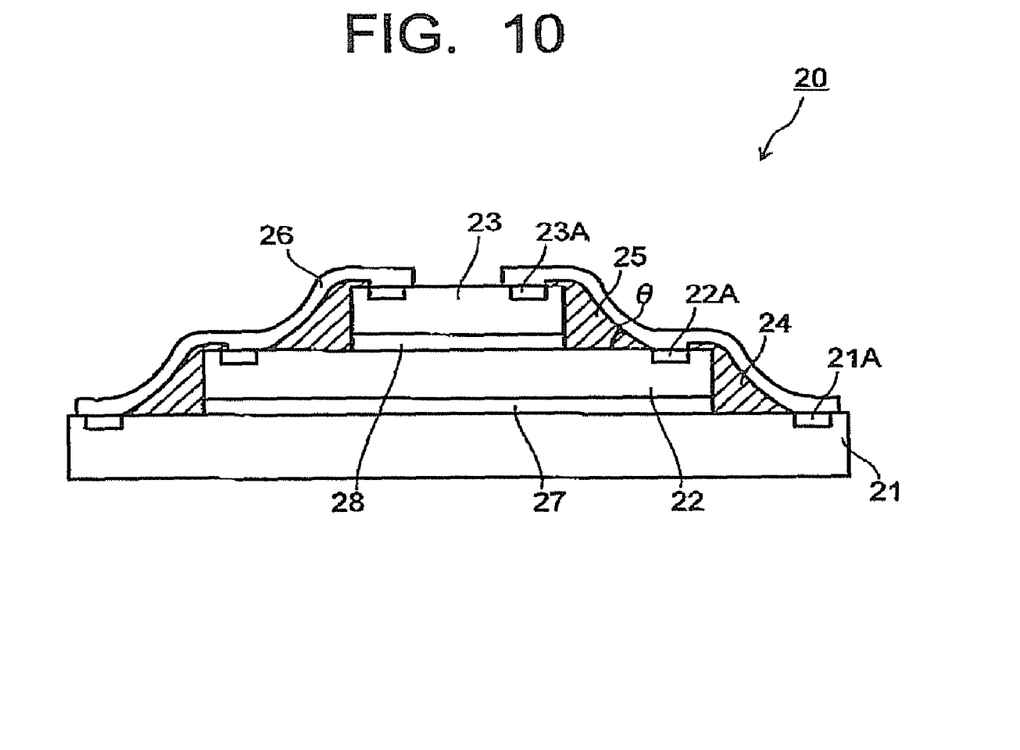
FIGS. 10 and 11 are cross sectional views showing a stacked semiconductor package according to an embodiment.
Figure 11:
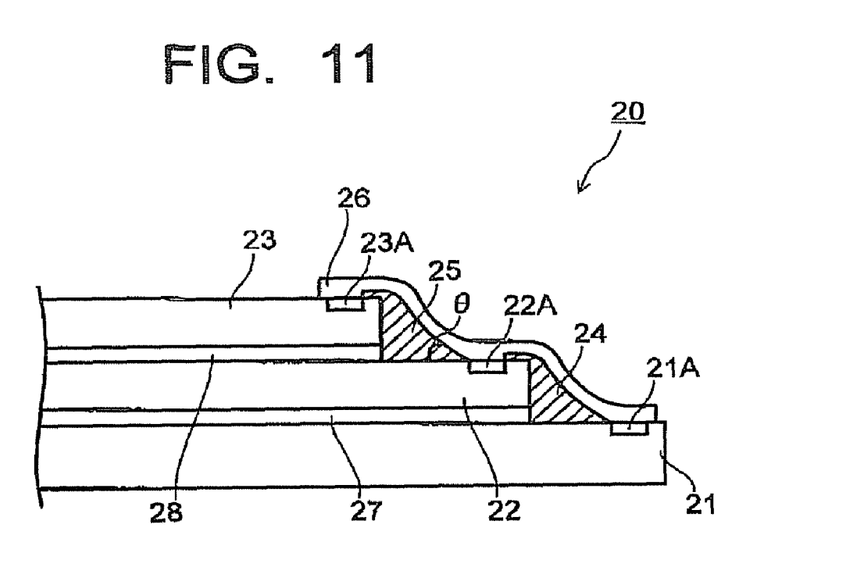

That the rising angles of the insulating resins 12 are small means that the contacting angle θ of the insulating layer of the upper semiconductor chip for the lower semiconductor chip is small (refer to, FIGS. 10 and 11). As a result, the insulating layer of the upper semiconductor chip is smoothly contacted with the lower semiconductor chip.

Therefore, even though the wiring layers are formed over the insulating layers of the sides of the semiconductor chips, the wiring layers can not be disconnected between the upper semiconductor chip and the lower semiconductor chip.

In this embodiment, since the sides of the semiconductor chip are covered with the insulating layers, respectively, even though the semiconductor chips are electrically connected with one another by means of wire bonding, the wires can not be directly contacted with the semiconductor chips (particularly, the edges of the semiconductor chips) by the formation of the wiring layers. As a result, the manageability of the wires can be simplified.

Figure 4:
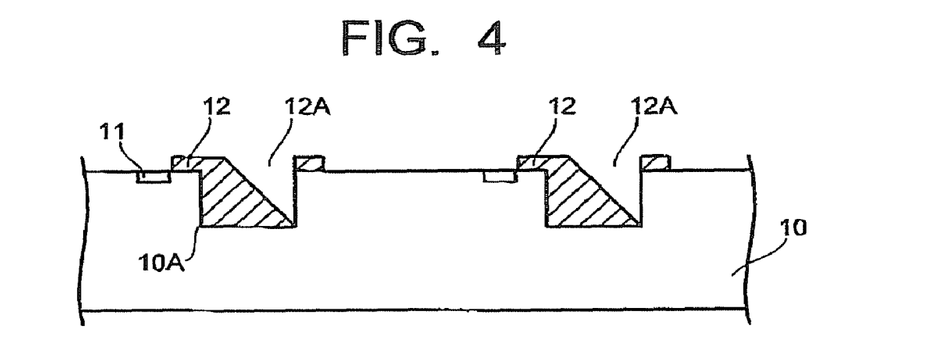

The second trenches 12A may be formed in another shape except the V-shape shown in FIG. 3 as occasion demands. For example, as shown in FIG. 4, the second trenches 12A may be formed so that the insulating resins 12 remain only at respective either sides of the first trenches 10A. When the second trenches 12A are formed in V-shape as shown in FIG. 3, the insulating resins 12 remain at both sides of the first trenches 10A, respectively, so that both sides of the resultant semiconductor chip are covered with the corresponding insulating layers. In contrast, when the second trenches 12A are formed so that the insulating resins 12 are formed at respective either sides of the first trenches 10A as shown in FIG. 4, either side of the resultant semiconductor chip is covered with the corresponding insulating layer.

In the former case, electric connection can be realized at both sides of the stacked semiconductor chips. In the latter case, electric connection can be realized at either side of the stacked semiconductor chips. Therefore, the second trenches 12 of V-shape as shown in FIG. 3 are effective in the case where a plurality of semiconductor chips with respective different semiconductor chips are stacked subsequently and the second trenches 12 of V-shape as shown in FIG. 4 are effective in the case where a plurality of semiconductor chips are stacked slidably. The concrete embodiment will be described below.

It is not always required that the second trenches 12A are formed so as to penetrate through the insulating resins 12, but it is required that the depths of the second trenches 12 are set to predetermined depths enough to cut off and divide the wafer 10 into the semiconductor chips.

Figure 5:
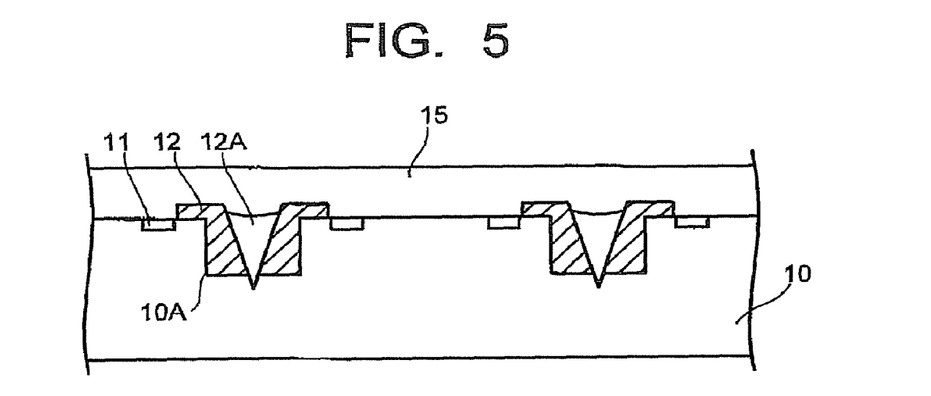
FIG. 5 is a cross sectional view showing a step modified from the step shown in FIG. 4.
Figure 6:
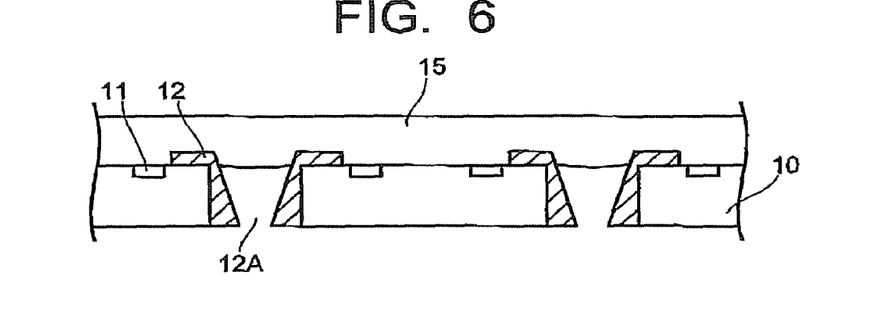

As shown in FIG. 5, a protective tape 15 is attached to the surface of the wafer 10 and the rear surface of the wafer 10 is grinded so as to thin the wafer 10 in a manner that the second trenches 12A are opened as shown in FIG. 6. In this way, the wafer 10 is divided into the semiconductor chips.

Figure 7:
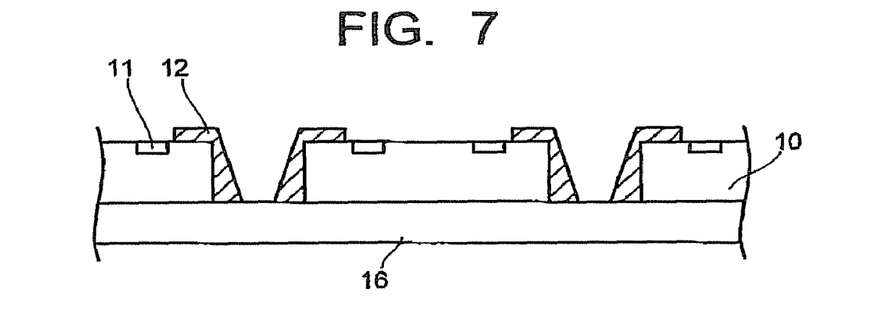
Figure 8:
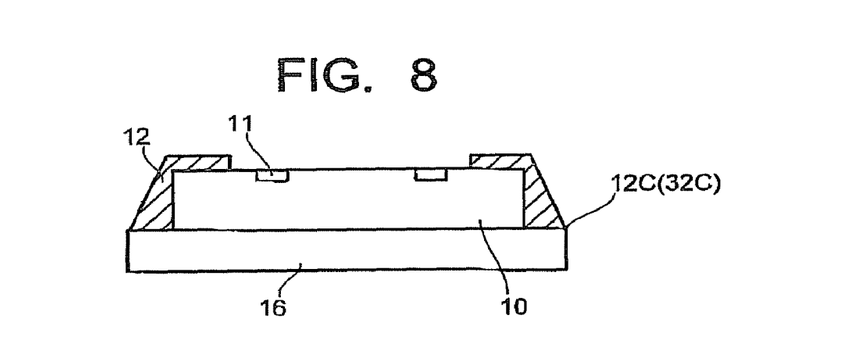
Figure 9:
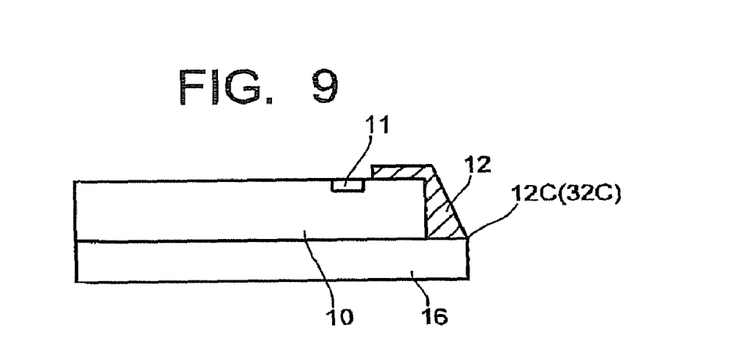
FIG. 9 is a cross sectional view showing a step modified from the step shown in FIG. 8.

As shown in FIG. 7, for example, an adhesive film 16 is attached to the rear surface of the wafer 10 (divided semiconductor chips), and by cutting the adhesive film 16, the semiconductor chip(s) as shown in FIG. 8 can be obtained. Herein, when the second trenches 12A are formed as shown in FIG. 4, the resultant semiconductor chip can be formed as shown in FIG. 9.

FIG. 10 is a cross sectional view showing a stacked semiconductor package formed by stacking the semiconductor chips as shown in FIG. 8. FIG. 11 is a cross sectional view showing a stacked semiconductor package formed by stacking the semiconductor chips as shown in FIG. 9.

In the stacked semiconductor package 20 shown in FIG. 10, a first semiconductor chip 22 is stacked on a board 21 via an adhesive layer 27, and a second semiconductor chip 23 is stacked on the center area of the main surface of the first semiconductor chip 22 via an adhesive layer 28. Then, the insulating layers 24 made of the remaining insulating resins 12 are formed at both sides of the first semiconductor chip 22, and the insulating layers 25 made of the remaining insulating resins 12 are formed at both sides of the second semiconductor chip 23. A part of the insulating layers 24 and 25 is provided on a top surface of the first semiconductor chips 22 and 23, respectively. The insulating layer 24 is elongated from a top surface of the first chip 22 to a top surface of the board 21 via a side of the first chip 22 and the adhesive layer 27. The insulating layer 25 is elongated from a top surface of the second chip 23 to a top surface of the first chip 22 via a side of the second chip 23 and the adhesive layer 27.

Moreover, wiring layers 26 are formed so as to cover the insulating layers 24 and 25 in a manner that electrodes 21A formed on the board 21 are electrically connected with electrodes 22A and 23A formed on the semiconductor chips 22 and 23, respectively.

On the other hand, in the stacked semiconductor package 20 shown in FIG. 11, the first semiconductor chip 22 is stacked on the board 21 via the adhesive layer 27 and the second semiconductor chip 23 is stacked and shifted on the main surface of the first semiconductor chip 22 so as to expose the end portion of the first semiconductor chip 22. Moreover, the insulating layer 24 made of the remaining insulating resin 12 is formed at either side of the first semiconductor chip 22, and the insulating layer 25 made of the remaining insulating resin 12 is formed at either side of the second semiconductor chip 23 in the same side as the insulating layer 24.

Then, wiring layers 26 are formed so as to cover the insulating layers 24 and 25 in a manner that the electrodes 21A on the board 21 are electrically connected with the electrodes 22A and 23A on the semiconductor chips 22 and 23, respectively.

In the stacked semiconductor package 20 shown in FIG. 10 or 11, the insulating layers 24 and 25 for electrically insulating between the wiring layers 26 and the semiconductor chips 22, 23 are formed before the semiconductor chips 22 and 23 are formed at the wafer processing process as described above. Namely, since the insulating layers 24 and 25 are formed at the wafer processing process for forming the semiconductor chips 22 and 23, the manufacturing efficiency of the semiconductor chips 22 and 23 can be enhanced.

Moreover, since no thermal treatment is required when the insulating layers 24 and 25 are formed, various problems such as the warpages of the board 21 and the semiconductor chips 22, 23 and the characteristic changes of the semiconductor chips 22, 23 due to the thermal treatment can be prevented. Then, the peeling-off of the adhesive layers 27 and/or 28 due to the thermal treatment can be prevented so that the semiconductor chip 22 can be sufficiently bonded with the semiconductor chip 23 and the semiconductor chip 22 can be sufficiently bonded with the board 21.

In this embodiment, since the electric conduction between the board 21 and the semiconductor chips 22, 23 can be realized by the wiring layers 26 under the condition that the insulating layers 24 and 25 are formed, the stacked semiconductor package 20 can be thinned as a whole.

Instead of the wiring layers 26 shown in FIGS. 10 and 11, bonding wires, which forms an arc, may be employed to electrically connect between the board 21 and the semiconductor chips 22, 23.

Second Embodiment

FIGS. 12 to 15 relate to the manufacturing process of a stacked semiconductor device according to a second embodiment. In the drawings, attention is paid to a portion of a wafer so as to clarify the distinctive features of the first embodiment. The portion of the wafer to which attention is paid is enlargedly depicted.

Figure 12:
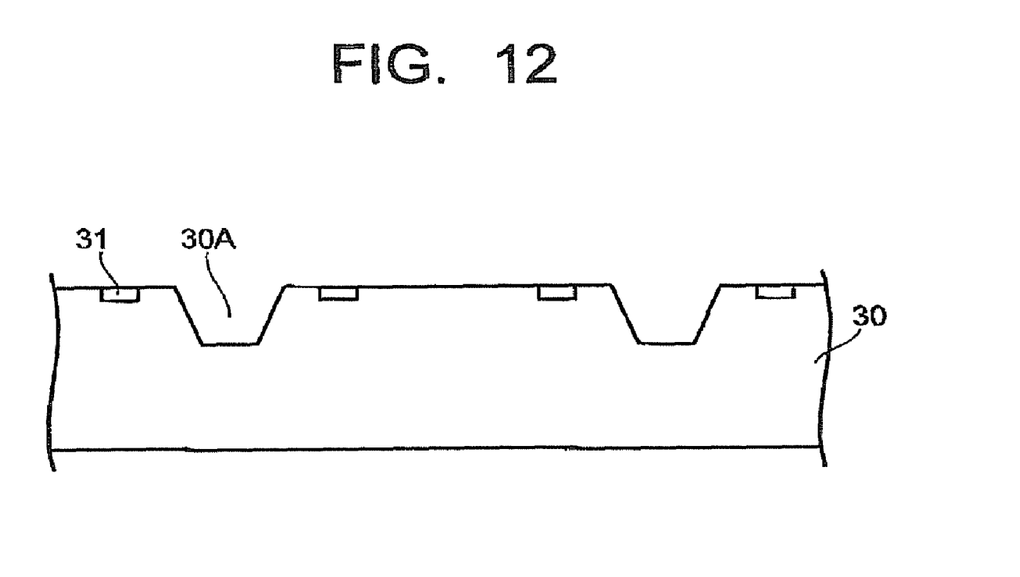
FIG. 12 to 14 are cross sectional views showing a first step in the forming method of a stacked semiconductor package according to a second embodiment.

As shown in FIG. 12, electrodes 31 are formed of electric conductor such as copper on a wafer 30 made of, e.g., silicon, and first trenches 30A are formed at the area except the electrodes 31 of the wafer 30 by RIE (reactive ion etching) or laser processing so as not to penetrate the wafer 30.

Figure 13:
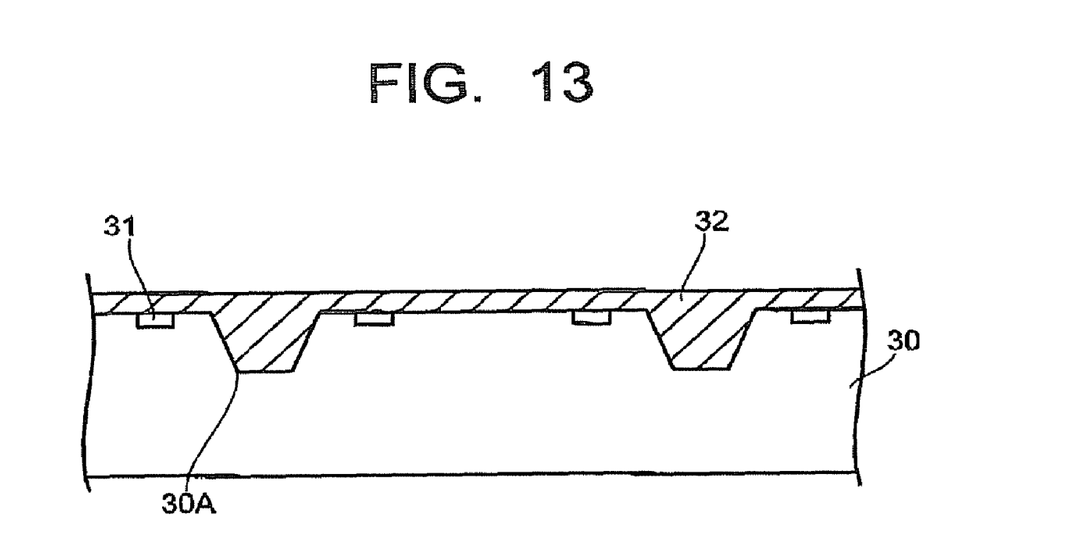

As shown in FIG. 13, a photosensitive member is applied onto the surface of the wafer 30 to form a photosensitive layer 32 so as to embed the first trenches 30A. The photosensitive member can be made of well known material such as photosensitive resin typified by polyimide or resist.

Figure 14:
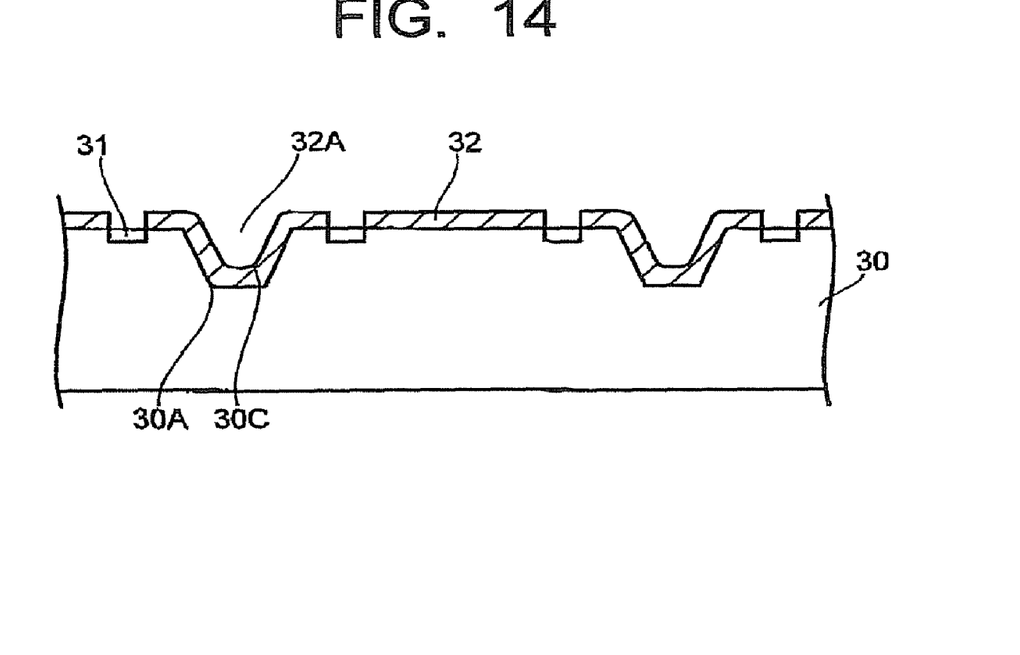

As shown in FIG. 14, a mask with a pattern in accordance with the shapes and sizes of the first trenches 30A and the desired pattern to be formed is prepared so that the photosensitive layer 32 is exposed and developed to form second trenches 32A at the photosensitive layer 32.

Figure 15:
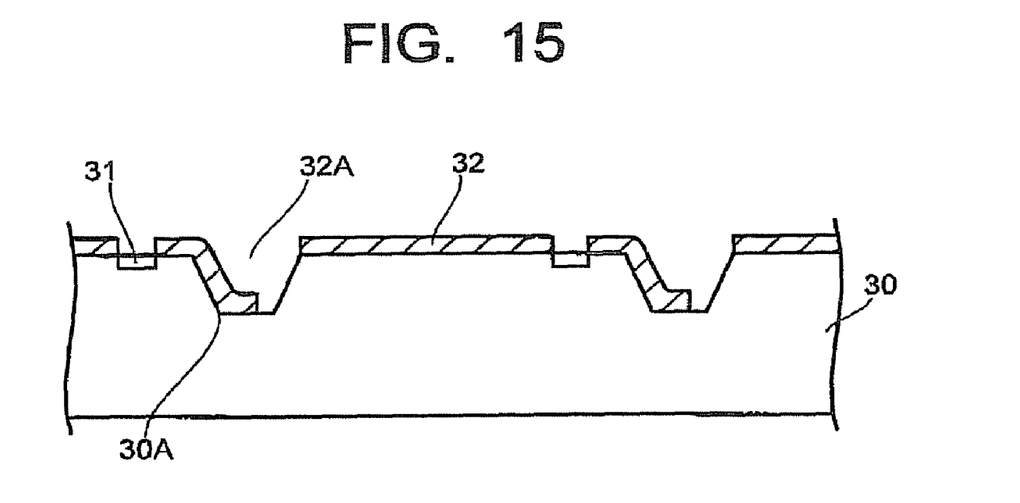
FIG. 15 is a cross sectional view showing a step after the step shown in FIG. 14.

In FIG. 14, the second trenches 32A are formed so that the photosensitive layer 32 remains at both sides of the first trenches 30A, respectively. However, the second trenches 32A may be formed at respective either sides of the first trenches 30A, as shown in FIG. 15.

In the case that the second trenches 32A are formed as shown in FIG. 14, since the photosensitive layer 32 remains at both sides of the first trenches 30A, respectively, insulating layers are formed at both sides of each of the resultant semiconductor chips to be stacked. In the case that the second trenches 32A are formed as shown in FIG. 15, since the photosensitive layer 32 remains at respective either sides of the first trenches 30A, insulating layers are formed at respective either sides of the resultant semiconductor chips to be stacked.

In the former case, electric connection can be realized at both sides of the stacked semiconductor chips. In the latter case, electric connection can be realized at either side of the stacked semiconductor chips. Therefore, the second trenches 12 as shown in FIG. 14 are effective in the case where a plurality of semiconductor chips with respective different semiconductor chips are stacked subsequently and the second trenches 12 as shown in FIG. 15 are effective in the case where a plurality of semiconductor chips are stacked slidably.

In FIG. 12, the first trenches 30A are shaped in inverted trapezoid. In this case, the rising angles of the remaining photosensitive layer 32 along the side walls of the first trenches 30A become relatively small, respectively, originated from the (inverted trapezoid) shapes of the first trenches 30A. As described above, the remaining photosensitive layer 32 constitutes the insulating layer(s) of the semiconductor chip as it is, and the lower portions 30C of the photosensitive layer 32 constitute the lower edge portion(s) of the insulating layer(s) of the semiconductor chip (FIGS. 8 and 9).

That the rising angles of the remaining photosensitive layer 32 along the side walls of the first trenches 30A are small means that the contacting angle θ of the insulating layer of the upper semiconductor chip for the lower semiconductor chip is small (FIGS. 10 and 11). As a result, the insulating layer of the upper semiconductor chip is smoothly contacted with the lower semiconductor chip.

Therefore, even though the wiring layers are formed over the insulating layers of the sides of the semiconductor chips, the wiring layers can not be disconnected between the upper semiconductor chip and the lower semiconductor chip.

In this embodiment, since the sides of the semiconductor chip are covered with the insulating layers, respectively, even though the semiconductor chips are electrically connected with one another by means of wire bonding, the wires can not be directly contacted with the semiconductor chips (particularly, the edges of the semiconductor chips) by the formation of the wiring layers. As a result, the manageability of the wires can be simplified.

The first trenches 30A may have another shape except the inverted trapezoid shape shown in FIG. 12 as occasion demands.

Then, a protective tape is attached to the surface of the wafer 30 and the rear surface of the wafer 30 is grinded so as to thin the wafer 30 in a manner that the second trenches 32A are opened in the same manner as FIGS. 5 to 9. In this way, the wafer 30 is divided into the semiconductor chips. An adhesive film is attached to the rear surface of the wafer 30 (divided semiconductor chips), and by cutting the adhesive film, the semiconductor chip(s) can be obtained.

As described above, the stacked semiconductor package as shown in FIG. 10 can be formed through the step shown in FIG. 14, and the stacked semiconductor package as shown in FIG. 11 can be formed through the step shown in FIG. 15. As a result, the stacked semiconductor package according to the second embodiment can exhibit the same function/effects as the stacked semiconductor package according to the first embodiment.

Although the present invention was described in detail with reference to the above examples, this invention is not limited to the above disclosure and every kind of variation and modification may be made without departing from the scope of the invention.

For example, in the embodiments, the second trenches 12A or 32A are formed in addition to the first trenches 10A or 30A so as to divide the wafer into the semiconductor chips, and then, opened by grinding the rear surface of the wafer. Instead of the formation of the second trenches 12A and 32A, for example, laser irradiation may be conducted for the insulating resins 12 and photosensitive layer 32 formed in the first trenches 10A and 30A, respectively, so as to divide the wafer into the semiconductor chips, after the first trenches 10A and 30A are embedded by the insulating resins 12 and the photosensitive layer 32, respectively.

What is claimed is:

1. A method for manufacturing a stacked semiconductor package where a plurality of semiconductor chips are stacked on a substrate, comprising:
   forming insulating layers at portions of a wafer corresponding to sides of the plurality of semiconductor chips when the plurality of semiconductor chips are in the wafer;
   processing the wafer so as to obtain the plurality of semiconductor chips;
   subsequently stacking the plurality of semiconductor chips on the substrate such that the insulating layers formed at the sides of the plurality of semiconductor chips are respectively positioned at the same side as one another; and
   forming a wiring over the insulating layers formed at the sides of the plurality of semiconductor chips so that the plurality of semiconductor chips are electrically connected with one another and one or more of the plurality of semiconductor chips are electrically connected with the substrate.

2. The method as set forth in claim 1, wherein the insulating layer is formed such that after a first trench is formed at the wafer so as not to penetrate through the wafer, an insulating material is embedded in the first trench and the wafer is cut into the plurality of semiconductor chips via the first trench.

3. The method as set forth in claim 2, wherein the wafer is cut into the plurality of semiconductor chips by irradiation of laser beam.

4. The method as set forth in claim 2, wherein a second trench is formed at the insulating material so that the wafer is cut into the plurality of semiconductor chips via the second trench.

5. The method as set forth in claim 4, wherein the second trench is formed in V-shape at the insulating material such that the insulating material remains at both sides of the first trench.

6. The method as set forth in claim 4, wherein the second trench is formed at the insulating material such that the insulating material remains at either side of the first trench.

7. The method as set forth in claim 4, wherein a rear surface of the wafer is grinded so that a bottom of the second trench is opened from the rear surface of the wafer to cut the wafer into the plurality of semiconductor chips.

8. The method as set forth in claim 1, wherein the insulating layer is formed such that after a first trench is formed at the wafer, a photosensitive material is embedded in the first trench and the wafer is cut into the plurality of semiconductor chips via the first trench.

9. The method as set forth in claim 8, wherein the wafer is cut into the plurality of semiconductor chips by irradiation of laser beam for the photosensitive material in the first trench.

10. The method as set forth in claim 8, wherein a second trench is formed in the photosensitive material through exposure and development so that the wafer is cut into the plurality of semiconductor chips via the second trench.

11. The method as set forth in claim 10, wherein the second trench is formed at the photosensitive material such that the photosensitive material remains at both sides of the first trench.

12. The method as set forth in claim 10, wherein the second trench is formed at the photosensitive material such that the photosensitive material remains at either side of the first trench.

13. The method as set forth in claim 1, wherein the first trench is shaped in inverted trapezoid.

14. The method as set forth in claim 1, wherein the insulating material is formed so as to be elongated from a top of the semiconductor chip to a side thereof.

15. The method as set forth in claim 1 wherein a thickness of the insulating layer at the side thereof is greater than a thickness of the insulating layer at a top thereof.

* * * * *